United States Patent [19]

Bailey et al.

[11] 4,172,758
[45] Oct. 30, 1979

[54] MAGNETIC BUBBLE DOMAIN DEVICE FABRICATION TECHNIQUE

[75] Inventors: Robert F. Bailey, Los Alamitos; A. Brooke Jones, La Mirada, both of Calif.

[73] Assignee: Rockwell International Corporation, El Segundo, Calif.

[21] Appl. No.: 629,816

[22] Filed: Nov. 7, 1975

[51] Int. Cl.² .............................................. C23F 1/02
[52] U.S. Cl. .................................. 156/643; 156/656; 156/659; 427/131; 365/32
[58] Field of Search ...................... 156/3, 8, 11, 17, 18, 156/643, 656, 659, 652; 29/604; 427/127–132, 43; 340/174, 174 TF

[56] References Cited

U.S. PATENT DOCUMENTS

| | | |
|---|---|---|
| 3,474,021 | 10/1969 | Davidse et al. ..................... 156/8 X |
| 3,671,312 | 6/1972 | Murakami et al. ............... 427/132 X |
| 3,677,843 | 7/1972 | Reiss ................................... 427/131 X |
| 3,738,865 | 6/1973 | Takeno et al. ..................... 427/131 X |
| 3,957,552 | 5/1976 | Ahn et al. ............................ 427/43 X |
| 3,967,002 | 6/1976 | Almasi et al. ......................... 427/132 |

Primary Examiner—William A. Powell
Attorney, Agent, or Firm—H. Fredrick Hamann; G. Donald Weber, Jr.

[57] ABSTRACT

A process for fabricating magnetic bubble domain devices having multiple layers. The process is a single high resolution mask process. A magnetizable layer, a conductive layer and at least one dielectric spacer layer are provided on a suitable magnetic bubble domain material and etched in a suitable manner such as by ion milling. The material layers may be applied such that the conductive layer is applied first and the magnetizable layer applied thereafter or vice versa.

9 Claims, 4 Drawing Figures

MAGNETIC BUBBLE DOMAIN DEVICE FABRICATION TECHNIQUE

BACKGROUND OF THE INVENTION

1. Field of the Invention

This invention relates to magnetic bubble domain devices, and in particular, methods and processes for fabricating such devices. The invention is directed primarily to a process having only one high resolution pattern step which permits improved yield to devices.

2. Prior Art

Circuit elements of magnetic bubble domain devices consist of patterns of high permeability, soft magnetic material (usually permalloy) formed into propagation paths for controlling magnetic bubble domains. The bubble domains are formed in a magnetic material such as a garnet film. Conductor loops are located, similar to the permalloy pattern, in close proximity to the garnet film. The conductor loops are used in conjunction with the permalloy elements to perform functions such as generation, annihilation, transfer, replication, and so forth, of magnetic bubble domains when a magnetic field producing current is passed therethrough.

Known single level devices consist of a high resolution permalloy pattern separated from the magnetic garnet film by an insulating spacer. The conductor loops required are produced in the permalloy at the same time as the propagation pattern is formed, thus requiring only one high resolution masking step and eliminating the need for alignment. This method reduces processing time and increases yield, but the circuits produced are generally inferior in performance, reliability and operating life relative to known two level circuits.

Two level devices have a separate conductor layer (usually copper-doped aluminum) in addition to the permalloy propagation pattern. Fabrication starts with deposition of a thin dielectric layer followed by the aluminum conductor layer on the magnetic garnet film. Conductor loops are then delineated using the first high resolution masking step, and defined by etching. Next, the insulating spacer layer and permalloy layer are deposited. Finally, the second high resolution mask is carefully aligned to the conductor pattern and the permalloy propagation pattern is defined.

This two level approach, while more costly, has two distinct advantages over the permalloy only single level approach: (1) the conductor loops are low resistivity aluminum instead of high resistivity permalloy, and (2) the conductor loops can be much closer to the garnet film whereby lower current pulses may be used. The disadvantages of this technique, as currently practiced, are that the range of magnetic bias field over which the circuit may be successfully operated is reduced due to the variation in permalloy-garnet spacing where the permalloy pattern crosses a conductor pattern. In addition, lower fabrication yields are achieved because of the tight registration tolerances required between the levels.

SUMMARY OF THE INVENTION

This invention relates to a process for making single level magnetic bubble domain circuits with the advantages of two level circuitry, but not the disadvantages. A single level, three layer device is fabricated by forming a composite comprising a conductive material, a dielectric insulator and a magnetizable material on a suitable bubble domain supporting material such as a magnetic garnet film. In some embodiments an additional thin dielectric may be inserted between the composite and the magnetic film. A high resolution masking step is performed wherein the pattern of the devices to be produced is defined by the mask. The device is then etched, as for example by R. F. plasma etching or by ion milling, through the several layers of the composite sandwich. This process produces virtually vertical walls with a high degree of dimensional control of the composite pattern and permits fabrication of a substantially planar device.

BRIEF DESCRIPTION OF PREFERRED EMBODIMENT OF THE INVENTION

Figure 1:
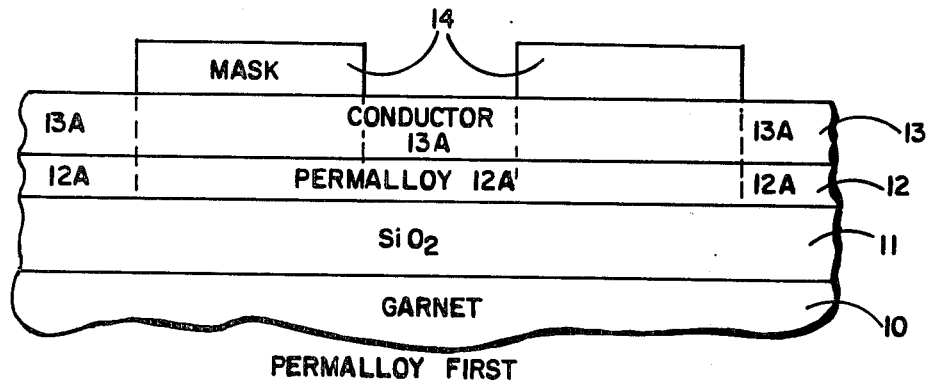
FIG. 1 is a side view of a composite formed in accordance with the present invention.

Referring now to FIG. 1, there is shown a side view of a composite formed in accordance with one embodiment of the instant invention. This embodiment is known as the "permalloy first" approach. Initially, a suitable base structure 10 is provided. The base structure, while labelled as garnet, may be any crystalline or amorphous film or layer of material which is capable of establishing magnetic bubble domains therein in the presence of an appropriate magnetic field as is known in the art. Any suitable type of material such as $G^3$ garnet, amorphous magnetic film or the like is contemplated. Layer 11 is a dielectric spacer of any suitable material such as $SiO_2$. Typically, spacer layer 11 is on the order of 1,000 Å–6,000 Å in thickness. Spacer layer 11 may be applied by sputtering or any suitable manner known in the art.

Layer 12 is a layer of permalloy on the order of 1,000 Å–3,000 Å in thickness which is deposited upon the surface of spacer layer 11 in any suitable manner. While layer 12 may be any magnetizable material, this layer is typically fabricated of permalloy.

On the surface of magnetizable layer 12, there is formed in any suitable manner, layer 13 of conductive material such as a metal or the like. In many applications, layer 13 is formed of aluminum which is doped with copper. Of course, gold or other materials can be used along with suitable adhesion layers. Layer 13 is, typically, on the order of 2,000 Å–5,000 Å in thickness.

Of course, all of the dimensions noted supra are appropriate for bubble domain devices with a stripwidth of about four microns. However, the dimensions should be scaled if magnetic films of different stripwidth (and, thus, different bubble diameter) are considered.

A film 14 of any suitable masking material, such as photoresist or the like, is placed over the surface of conductor layer 13. The mask layer 14 is appropriately perfected such as by exposure to a suitable pattern, development of the mask and removal of the unwanted portions thereof. The mask, thus, defines the general pattern of the circuitry or magnetic device structure. By a suitable etching technique such as plasma etching or ion milling, the material which is not masked is removed. By using ion milling, a high resolution etching operation can be achieved. Moreover, the circuitry can be defined to have sidewalls which are 80° (or better) relative to the surface of the SiO$_2$ spacer. Of course, the steeper the sidewalls of the circuitry, the better the resolution and the better the packing density which can be achieved in the overall system. As a result of the etching procedure, portions 13A of the conductor layer and portions 12A of the permalloy layer (as defined by the dashed lines) are removed.

Figure 2:
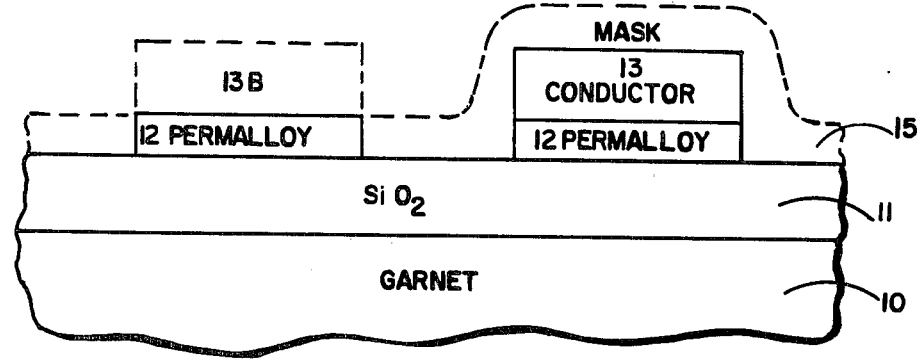
FIG. 2 is a side view of the composite shown in FIG. 1 after additional operations thereon.

Referring now to FIG. 2, there is shown the structure which evolves from the structure of FIG. 1 wherein portions 13A and 12A have been removed along with mask 14. As shown in FIG. 2, another mask 15 is applied to the composite structure. Mask 15 is a "gross" mask which has relatively low resolution definition. This mask is utilized in procedures which do not have high resolution requirements. Typically, mask 15 is utilized when conductor material is being removed from the permalloy layer in the detector portion of the device. As suggested in FIG. 2, a suitable etching process which, in this case may be a chemical etch, is performed. This chemical etch is used to remove portions 13B of the conductive layer which are not essential or which interfere with proper circuit functions in areas such as a detector area where an all permalloy structure is utilized.

The finished structure will have the general configuration suggested in FIG. 2. Of course, mask 15 is removed in a normal manner and the entire structure is passivated. To the extent necessary, bonds are made to the conductor or pads formed in the conductive layer and the devices are diced and mounted in a standard manner as is known in the art. Typically, it is possible to achieve environmental and mechanical passivation of bubble domain devices by several methods. For example, a liquid emulsitone containing a large amount of SiO$_2$ is spun, sprayed or dipped onto the device/wafer and cured to produce a specific thickness coating on the sample. The coating is capable of resisting minor abrasion and most environmental influences detrimental to the bubble memory device.

Alternatively, a polyvinyl-copolymer is spun, sprayed or dipped onto a bubble domain memory device/wafer to provide a controllable thickness film capable of protecting the device/wafer from most minor abrasions and environmental influence which may be detrimental to the device. This film may also be thermal-compression bonded through.

Also, a commercially available silicone elastomeric compound, i.e. a heavy liquid containing ~100% solids, is used for semiconductor junction coating. Properly thinned, this liquid may be spun, sprayed or dipped onto the device/wafer and when properly cured will provide a very tough specific thickness film which will protect the sample from more than slight abrasions and extended time of exposure to normally degrading environments.

These passivating procedures are reported in reports to the U.S. Air Force under contract number DAAB05-73C-2057.

Figure 3:
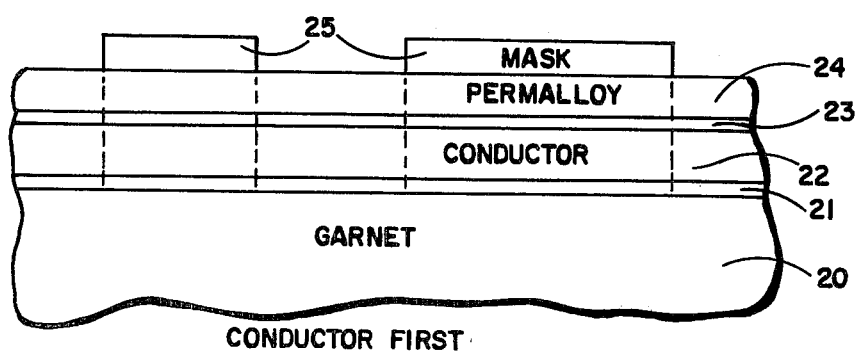
FIG. 3 is a side view of another composite which represents another embodiment of the instant invention.

Referring now to FIG. 3, there is shown a composite which is formed in conjunction with another embodiment of the instant invention. In this embodiment, referred to as the conductor first embodiment, a suitable magnetic bubble domain material 20 is provided. Again, this material may be garnet or any other suitable material whether crystalline or amorphous, and film dimensions quoted are those appropriate for a garnet of 4 $\mu$m stripwidth. For materials with different stripwidth, different dimensions may be desired. A barrier layer of SiO$_2$ or other similar dielectric is applied to the surface of garnet 20 in a suitable manner. Barrier layer 21 is, typically, on the order of about 500–1,000 Å in thickness.

Conductor layer 22 is formed, in any suitable manner, on the surface of dielectric barrier 21. Conductor layer 22 may be aluminum, aluminum doped with copper or any other suitable conductor material. Conductor layer 22 is typically on the order of 4,000 Å in thickness.

Spacer layer 23 is formed of a dielectric material such as SiO$_2$ on the surface of conductor 22. This dielectric spacer layer is, typically, on the order of 500–1,000 Å in thickness.

Layer 24 of magnetizable material such as permalloy is then formed in a suitable manner on the surface of spacer layer 23. Layer 24 is typically on the order of 3,000 Å in thickness.

A suitable mask 25 is formed on the surface of layer 24 in a standard manner as described supra. This mask defines, with high resolution, the pattern of the structure to be formed for the magnetic bubble domain devices and systems. A suitable etching process, for example the ion milling process described supra, is utilized to remove the materials from the unmasked regions and suggested by the dashed lines.

Figure 4:
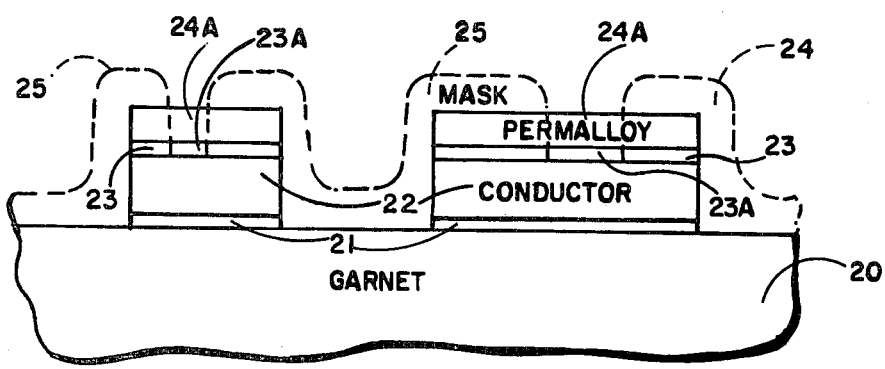
FIG. 4 is a side view of the composite shown in FIG. 3 after additional operations have been performed thereon.

Referring now to FIG. 4, there is shown the composite which is formed as a result of the ion milling (or similar etching procedure) noted supra. An additional mask 25 is formed over the resulting structure which includes the elements suggested. Mask 25 is appropriately exposed, developed and so forth to define the location of bonding pads for interconnection purposes. Mask 25 is a relatively low resolution mask inasmuch as the mask has lower tolerance requirements on positioning. A chemical etch or the like is used to remove portions 23A and 24A from the permalloy and spacer materials in the respective elements. After removal of this material, mask 25 is removed and appropriate operations (not described herein) are performed to form the interconnection to the conductor layer through the openings produced with the removal of materials 23A and 24A. Thereafter, the device is passivated, diced, mounted and any other appropriate operations with regard to the devices are performed.

Thus, there are shown and described composites which are formed by the process which is described herein. This process provides a so-called single level, multi-layer device which uses the universality and directionality of ion beam milling. It also provides a new pattern definition technique to produce a single level circuit with the advantages of a two level circuit but without the disadvantages caused by the non-planar relationship of the permalloy pattern and the increased fabrication costs of the two mask level process. While each of these processes describes a planar device, each of the devices has advantages relative to the other. For example, the "conductor-first" approach of FIGS. 3 and 4 has the advantage of close coupling between conductor loops and the garnet. However, this approach requires longer milling times during the ion milling, has rather tall narrow structures which are subject to mechanical damage and requires more films on the garnet. In addition, this method is not as useful for extremely small bubble films where the optimum permalloy film spacing is less than the required conductor thickness.

In the "permalloy-first" structure as shown in FIGS. 1 and 2, only three deposited films are required, and this approach is extremely desirable for use with the extremely small bubble circuits. In addition, although the conductor-garnet spacing is larger in this approach, the conductor can be made thicker than in the conductor-first circuits whereby lower resistance conductor loops are produced. Moreover, in the permalloy-first approach, the permalloy and the conductor are in direct contact thereby reducing resistance of the system.

The methods described herein are completely compatible with different types of circuit patterns, including the so-called "gapless" propagation patterns. Moreover, the structures shown and described herein have the advantage of planar permalloy elements which results in high quality operation over an extremely wide bias field range. In fabrication using these processes, there is a very low labor content wherein yield of devices is extremely high.

Thus, there is shown and described a process which permits the fabrication of substantially planar magnetic bubble domain devices. This process may find variations which are suggested to those skilled in the art. However, any application which falls within the purview of the description is intended to be included herein. The description, as noted above, is intended to be illustrative only and not limitative. It is clear that different materials can be used or substituted for the materials which are suggested by the description. Consequently, the scope of the invention is limited only by the claims appended hereto.

Having thus described a preferred embodiment of the invention, what is claimed is:

1. A one-level, multilayer process for fabricating planar magnetic bubble domain devices comprising the steps of:
   providing a layer of material which supports magnetic bubble domains therein;
   producing a dielectric layer on a surface of said layer of material to form a composite;
   forming a layer of electrically conductive material on said composite;
   forming a layer of magnetizable material on said composite;
   masking portions of the composite including said layers of conductive material and magnetizable material to define a pattern thereon; and
   etching through the unmasked portions of both said layer of conductive material and said layer of magnetizable material using a single dry etching process in order to produce with high resolution the pattern defined by said mask thereby to form a patterned arrangement of said layer of magnetizable material and said layer of electrically conductive material on said composite.

2. The process recited in claim 1 wherein said layer of magnetizable material is formed on said dielectric layer of said arrangement; and
   said layer of conductive material is formed on said layer of magnetizable material.

3. The process recited in claim 1 including the step of producing a further dielectric layer between said layer of conductive material and said layer of magnetizable material.

4. The process recited in claim 3 wherein
   said layer of conductive material is formed on said dielectric layer of said composite, and
   said layer of magnetizable material is formed on said further dielectric layer.

5. The process recited in claim 1 including the steps of
   masking said patterned arrangement to define a pattern thereon; and
   etching portions of at least one of said layers of conductive material and magnetizable material.

6. The process recited in claim 1 including the step of passivating said patterned arrangement.

7. The process recited in claim 1 wherein said layer of conductive material is formed to about 2000 Å–5000 Å thickness;
   said layer of magnetizable material is formed to about 1000 Å–3000 Å thickness; and
   said dielectric layer is formed to about 500 Å–6000 Å thickness.

8. The process recited in claim 7 wherein said dielectric layer comprises at least two separate dielectric layers each of which is formed to about 1000 Å thickness.

9. The process recited in claim 5 wherein the first mentioned etching is performed with an ion milling procedure, and
   the second mentioned etching is performed with a chemical etching process.

* * * * *